United States Patent
Knoll et al.

(10) Patent No.: US 10,490,658 B2
(45) Date of Patent: Nov. 26, 2019

(54) POWER SEMICONDUCTOR DEVICE

(71) Applicant: ABB Schweiz AG, Baden (CH)

(72) Inventors: Lars Knoll, Wohlenschwil (CH); Renato Minamisawa, Windisch (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/052,981

(22) Filed: Aug. 2, 2018

(65) Prior Publication Data

US 2018/0350977 A1 Dec. 6, 2018

Related U.S. Application Data

(63) Continuation of application No. PCT/EP2017/051156, filed on Jan. 20, 2017.

(30) Foreign Application Priority Data

Feb. 2, 2016 (EP) ..................................... 16153826

(51) Int. Cl.
  *H01L 29/78* (2006.01)
  *H01L 29/06* (2006.01)
  (Continued)

(52) U.S. Cl.
  CPC ...... *H01L 29/7813* (2013.01); *H01L 29/0696* (2013.01); *H01L 29/0869* (2013.01);
  (Continued)

(58) Field of Classification Search
  CPC ............. H01L 29/7813; H01L 29/0696; H01L 29/0869
  (Continued)

(56) References Cited

U.S. PATENT DOCUMENTS 6,060,731 A 5/2000 Murata et al.
6,194,741 B1 2/2001 Kinzer et al.
(Continued)

FOREIGN PATENT DOCUMENTS

EP 1434274 A2 6/2004

OTHER PUBLICATIONS

European Patent Office, International Search Report & Written Opinion issued in corresponding Application No. PCT/EP2017/051156, dated Mar. 21, 2017, 11 pp.
(Continued)

*Primary Examiner* — Sheikh Maruf
(74) *Attorney, Agent, or Firm* — Taft Stettinius & Hollister LLP; J. Bruce Schelkopf

(57) ABSTRACT

A power semiconductor device includes a plurality of vertical field effect transistor cells arranged in a plurality of parallel rows, each row including vertical field effect transistor cells arranged along a first direction, wherein in each vertical field effect transistor cell a body region is surrounded by the gate layer from two lateral surfaces of the body region opposite to each other. In each row of vertical field effect transistor cells the body regions are separated from each other in the first direction by first gate regions of the gate layer, each first gate region penetrating through the body layer, so that in each row of vertical field effect transistor cells the first gate regions alternate with the body regions along the first direction. The first gate regions within each row of vertical field effect transistor cells are connected with each other by second gate regions extending across the body regions of the respective vertical field effect transistor cells in the first direction. The first gate regions and the second gate regions form continuous gate strips extending with its longitudinal axis in the first direction. A source electrode is formed on the source layer to form a first ohmic
(Continued)

contact to the source layer between each pair of adjacent gate strips. The whole top surface of the body region facing away from the substrate layer is in direct contact with the gate insulation layer.

20 Claims, 6 Drawing Sheets

(51) Int. Cl.
*H01L 29/10* (2006.01)
*H01L 29/423* (2006.01)
*H01L 29/08* (2006.01)
*H01L 29/16* (2006.01)

(52) U.S. Cl.
CPC ...... *H01L 29/1095* (2013.01); *H01L 29/4238* (2013.01); *H01L 29/1608* (2013.01); *H01L 29/4236* (2013.01); *H01L 29/42368* (2013.01)

(58) Field of Classification Search
USPC ........................................................ 257/330
See application file for complete search history.

(56) References Cited

U.S. PATENT DOCUMENTS

| | | | |
|---|---|---|---|
| 6,476,443 B1 | 11/2002 | Kinzer | |
| 7,692,239 B2 * | 4/2010 | Nagaoka | H01L 29/0634 257/335 |
| 2003/0213993 A1 * | 11/2003 | Spring | H01L 29/0623 257/330 |
| 2004/0124465 A1 * | 7/2004 | Onishi | H01L 29/0634 257/341 |
| 2006/0054970 A1 * | 3/2006 | Yanagida | H01L 29/1095 257/330 |
| 2011/0006363 A1 * | 1/2011 | Hsieh | H01L 29/7813 257/330 |
| 2011/0018004 A1 * | 1/2011 | Shimizu | H01L 29/0696 257/77 |
| 2013/0001679 A1 * | 1/2013 | Omori | H01L 21/76897 257/330 |
| 2013/0299901 A1 * | 11/2013 | Hsieh | H01L 29/7813 257/330 |
| 2014/0034969 A1 | 2/2014 | Nakano | |
| 2014/0110779 A1 * | 4/2014 | Tamaki | H01L 29/66727 257/330 |
| 2015/0115355 A1 * | 4/2015 | Hirler | H01L 29/7813 257/331 |
| 2016/0104773 A1 * | 4/2016 | Kelkar | H01L 29/407 257/334 |
| 2018/0096991 A1 * | 4/2018 | Nasu | H01L 29/4238 |
| 2018/0350977 A1 * | 12/2018 | Knoll | H01L 29/4238 |

OTHER PUBLICATIONS

European Patent Office, Extended Search Report issued in corresponding Application No. 16153826.9, dated Aug. 2, 2016, 9 pp.
Tega et al., "Novel trench-etched double-diffused SiC MOS (TED MOS) for overcoming tradeoff between RonA and Qgd," Proceedings of the 27th International Symposium on Power Semiconductor Devices & IC's, May 10-14, 2015, Kowloon Shangri-La, Hong Kong, pp. 81-84.

* cited by examiner

POWER SEMICONDUCTOR DEVICE

FIELD OF THE INVENTION

The present invention relates to a power semiconductor device and in particular to a trench field effect transistor device having a plurality of vertical field effect transistor (FET) cells.

BACKGROUND OF THE INVENTION

From EP 1 434 274 A2 there is known a buried gate-type semiconductor device in which the interval between adjacent buried gate is minimized so as to improve channel concentration thereby realizing low ON-resistance. Voltage-resistance reduction due to the concentration of electrical fields in the vicinity of the bottom of the gates is prevented and good OFF characteristics are achieved at the same time by means of $P^+$ body regions deeper than the bottom portion of the buried gates. A plurality of gate electrodes each having a rectangular section are disposed in the plane of a substrate. The interval between the long sides of the gate electrodes is made shorter than the interval between the short sides thereof. Further, a belt-like contact opening is provided between the short sides of the gate electrode, so that $P^+$ body regions and $N^+$ source region are in contact with a source electrode.

From U.S. Pat. No. 6,194,741 B1 there is known a MOS gated trench type power semiconductor device which is formed in 4H silicon carbide with the low resistivity direction of the silicon carbide being the direction of current flow in the device drift region. A P type diffusion at the bottom of the U shaped grooves in N-silicon carbide helps to prevent breakdown of the gate oxide at the trench bottom edges. The gate oxide may be shaped to increase its thickness at the bottom edges and has a trapezoidal or spherical curvature.

From US 2011/00818004 A1 there is known there is known a silicon carbide trench MOSFET possessing both narrow regions where the p body concentration is low, and wide regions where the p body concentration is high. The source electrode is in direct contact with a stripe-shaped $p^+$ type region between two neighboring rows of trench MOSFET cells.

Most of the commercially available power field effect transistors based on silicon carbide (SiC) are implemented with a planar design, where a channel is formed on a surface of a wafer, such as in a vertical double diffused metal oxide semiconductor field effect transistor (VDMOS). However, current densities in these devices are difficult to increase since the p-type implantations in an n-channel VDMOS form the gates of a parasitic junction field effect transistor (JFET) that tend to reduce the width of the current flow. Accordingly, the on-state resistance is relatively high in such known device. The power MOSFETs have a parasitic bipolar junction transistor (BJT) as an integral part of its structure. The body region serves as the base, the source as the emitter and the drain as the collector of the parasitic BJT. To keep this parasitic BJT in an off-state at all times by keeping the potential of the base as close to the emitter potential as possible the body and the source of the MOSFET is shortened. Otherwise, the potential at the base may turn on the parasitic BJT and lead the device into the "latchup" condition, which would destroy the device. Therefore, in the known n-channel VDMOS the p-well forming the body region is connected to the source metallization, so that the parasitic BJT is shorted. In order that the short has little resistance, the doping is increased at this spot by an additional $p^+$-implantation, followed by a diffusion step to form highly doped p-type body contact regions.

Trench metal oxide semiconductor field effect transistors (MOSFETs) with a U-shaped channel enable the achievement of low on-state resistance because of lack of the parasitic JFET. Additionally, for SiC, the trench MOSFET architecture permits optimization of carrier mobility by designing the channel with respect to different crystallographic planes. A SiC trench MOSFET is known for example from US 2014/0034969 A1. As in an n-channel VDMOS, also in an n-channel trench MOSFET the p-type body regions include the highly doped p-type contact regions which are connected to the source metallization to shorten the parasitic BJT, which is present also in the trench MOSFET.

In the Proceedings of the $27^{th}$ International Symposium on Power Semiconductor Devices & ICs (ISPSD), May 10-14, 2015, Kwoloon Shangri-La, Hong Kong, it is disclosed the so called trench-etched double-diffused SiC MOS (TED MOS) in order to improve both conduction loss and switching loss. It is claimed that the trench side channels of TED MOS can provide both high channel mobility and wide channel width to decrease on-state resistance ($R_{on}A$). Moreover, TED MOS also achieves low gate-to-drain capacitance $Q_{gd}$ because its gates and trenches are completely covered with a P-body region. Experimental results show that the figure of merit ($R_{on}A \cdot Q_{gd}$) of the TED MOS can be reduced by 70% compared to that of a conventional DMOS. In fact, the TED MOS design is basically a planar design with extended channel area, where the current flows horizontally. The drawback of such design is the long channel length required, which reduces on-state current, as well as the need for large areas for its cells and the presence of JFET regions, which increase the on-state resistance as discussed above for the known VDMOS.

It is the object of the invention to provide a power semiconductor device with higher on-state current while suppressing short channel effects.

The object of the invention is attained by a power semiconductor device according to claim 1.

The power semiconductor device of the invention is a power field effect transistor device that has a trench with a double gate, where the current flows vertically. Contrary to the known standard trench design of vertical power MOSFETs, the power semiconductor device of the invention creates multi-gate regions to thereby enhance the gate control. This is achieved by a different three-dimensional layout of the device regarding the source layer and the distribution of first ohmic contacts in an area between each pair of adjacent gate strips as defined in claim 1. In the power semiconductor device of the invention the double gate distance, which is the distance between the two lateral surfaces of a body region in a vertical FET cell, can be reduced to achieve improved electrostatic gate control and, therefore, a higher on-state current. The specific layout of the invention allows a better packing, i.e. a higher density of vertical FET cells and, therefore, a higher on-state current. In the invention, the source layer does not extend onto the top surface of each body region, such that the whole top surface of the body region facing away from the substrate layer is in direct contact with the gate insulation layer. This has the advantage that the body region is free of electrons in the off-state.

Further developments of the invention are specified in the dependent claims.

In an exemplary embodiment, a body contact region is arranged between each pair of adjacent gate strips, each body contact region being a semiconductor region of the second conductivity type having a doping level higher than that of the body layer and penetrating through the source layer to extend to and contact the body layer, wherein the source electrode is arranged on the body contact region to form a second ohmic contact to the body contact between each pair of adjacent gate strips. In this exemplary embodiment a parasitic bipolar junction transistor (BJT) is efficiently shortened.

In an exemplary embodiment, a distance between the two lateral surfaces of each body region is 1 µm or less, exemplarily 500 nm or less, more exemplarily 100 nm or less and more exemplarily 20 nm or less. With reduced distance between the lateral surfaces of each body region, i.e. with reduced double gate distance electrostatic gate control can be enhanced and accordingly a higher on-state current can be achieved. The effect becomes significant at a distance between the lateral surfaces of each body region (double gate distance) of about 1 µm. In addition, short-channel effects can be significantly reduced at the same time due to enhanced electrostatic gate control in forward direction.

In an exemplary embodiment, a first thickness of a first portion of the gate insulation layer separating the lateral surface of each body region from the gate layer is in a range between 10 nm and 100 nm.

In an exemplary embodiment, a second thickness of a second portion of the gate insulation layer separating the top surface of each body region from the gate layer is in a range between 10 nm and 500 nm.

In an exemplary embodiment, a ratio between the first thickness and the second thickness is less than 0.5. A design where the second thickness is relatively higher than the first thickness has the advantage that the switching speed can be increased.

In an exemplary embodiment, the distance between each pair of body regions neighboring in the first direction is 1 µm or less, exemplarily 500 nm or less, more exemplarily 100 nm or less and more exemplarily 20 nm or less.

In an exemplary embodiment, the source layer extends onto the top surface of each body region.

In an exemplary embodiment, the whole top surface of each body region is separated from the gate insulation layer in a direction vertical to the main surface of the substrate layer.

In an exemplary embodiment, a semiconductor well of the second conductivity type is formed on a bottom side of each first gate region facing towards the substrate layer, the semiconductor well region being separated and electrically insulated from the first gate region by the gate insulation layer. The semiconductor well can electrostatically protect the gate of the device.

In an exemplary embodiment, at least the substrate layer, the body layer and the source layer are formed of silicon carbide.

In an exemplary embodiment, each body contact region between two adjacent gate strips is a continuous strip-shaped region. Throughout the description a strip-shaped region is a long, narrow region having a significantly larger dimension along its longitudinal axis than along any other direction perpendicular to the longitudinal axis. A dimension is considered to be significantly lager if it is at least three times larger. With such design the parasitic bipolar transistor formed by the body region (base of the parasitic BJT), the source (emitter of the parasitic BJT) and the drain (collector of the parasitic BJT) can be kept in an off-state most reliably.

In an exemplary embodiment, at least the body regions of each row of vertical field effect transistors are connected with each other by a continuous portion of the body layer.

In an exemplary embodiment, the lateral surfaces of each body region are parallel to each other. With such design a good homogeneous electrostatic gate control throughout the body region can be ensured.

In an exemplary embodiment, the substrate layer comprises a drift layer and a drain layer, the drain layer having a higher doping level than the drift layer and being separated from the body layer by the drift layer.

BRIEF DESCRIPTION OF THE DRAWINGS

Detailed embodiments of the invention will be explained below with reference to the accompanying figures, in which.

The reference signs used in the figures and their meanings are summarized in the list of reference signs. Generally, similar elements have the same reference signs throughout the specification. The described embodiments are meant as examples and shall not limit the scope of the invention. The comparative example described with FIGS. 1 to 4 does as such not form part of the claimed invention but serves for a better understanding thereof.

DETAILED DESCRIPTION OF PREFERRED EMBODIMENTS

Figure 1:
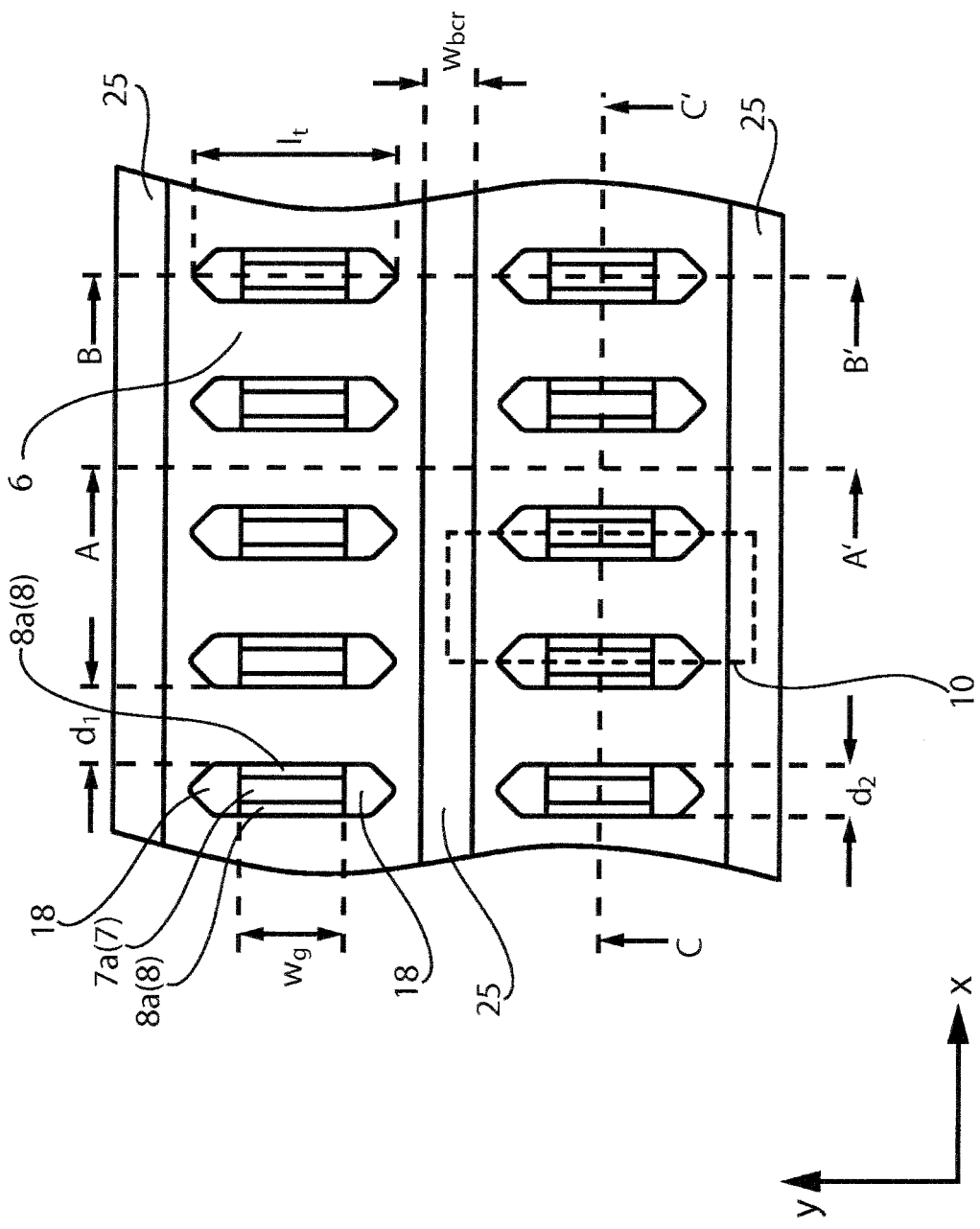
FIG. 1 shows a power semiconductor device according to a comparative example in cross-section along a horizontal plane H indicated in FIGS. 2 to 6 (which does as such not form part of the claimed invention.

In the following there is discussed a power semiconductor device according to a comparative example with reference to FIGS. 1 to 4. In FIG. 1 there is shown a horizontal cross-section along a horizontal plane H indicated in FIGS. 2 to 4 which show different vertical cross-sections along lines AA', BB' and CC' in FIG. 1, respectively. The horizontal plane H extends in a first horizontal directions x and in a second horizontal direction y, which is perpendicular to the first horizontal direction x.

The power semiconductor device according to the comparative example as discussed in the following with reference to FIGS. 1 to 4 is a multi-gate trench silicon carbide (SiC) power MOSFET device 1 (in the following briefly referred to as device 1). As can be seen from the various vertical cross-sections shown in FIGS. 2 to 4, it comprises an n-type drift layer 2 and an n-type drain layer 3 provided on the drift layer 2 on a drain side of the device 1. A doping level of the drift layer 2 is lower than that of the drain layer 3. The doping level of the drift layer 2 is for example in the range between $5 \cdot 10^{14}$ cm$^{-3}$ and $10^{17}$ cm$^{-3}$ and the doping level of the drain layer 3 is for example in a range between $10^{18}$ cm$^3$ and $10^{20}$ cm$^3$. The drift layer 2 and the drain layer 3 form an n-type substrate layer 4 of the device 1. The substrate layer 4 is planar and defines a main surface M extending in a horizontal direction. In a direction vertical to the main surface M the thickness of the drift layer 2 is for example in a range between 5 µm and 200 µm, while the thickness of the drain layer 3 may be in a range between 1 µm and 500 µm, for example. On a side of the drain layer 3 opposite to the drift layer 2 there is provided a drain contact 35, which is exemplarily implemented as a metallization layer forming an ohmic contact to the drain layer 3.

On a main surface side of the substrate layer 4 opposite to the drain side of the device 1 is arranged a p-type body layer 5 on the substrate layer 4, such that the drain layer 3 is separated from the body layer 5 by the drift layer 2. The thickness of the body layer 5 in a vertical direction z perpendicular to the main surface M is for example in a range between 0.1 and 1.0 µm and determines the channel length of the device 1. The doping level of the body layer 5 is for example $5 \cdot 10^{16}$ cm$^{-3}$ or higher. A first pn-junction of the device 1 is formed by the drift layer 2 and the body layer 5.

An n$^+$-type source layer 6 is provided on the body layer 5, the source layer 6 and the body layer 5 forming a second pn-junction of the device 1, which is separated from the first pn-junction of the device 1 by the body layer 5.

An electrically conductive gate layer 7 is arranged to penetrate through the body layer 5, a gate insulation layer 8 electrically insulating the gate layer 7 from the drift layer 2, from the body layer 5 and from the source layer 6. The electrically conductive gate layer 7 may be made of electrically conductive polycrystalline silicon (poly-Si). At least the substrate layer 4, the body layer 5 and the source layer 6 are formed of silicon carbide (SiC). Any one of the known silicon carbide polytypes can be used, such as 3C—SiC, 2H—SiC, 4H—SiC or 6H—SiC, for example. The gate insulation layer 8 is for example made from silicon oxide.

The device 1 includes a plurality of identical vertical field effect transistor (FET) cells 10, wherein the plurality of vertical FET cells 10 are arranged in a plurality of parallel rows, each row including vertical FET cells 10 arranged along the first horizontal direction x as shown in FIG. 1. In each vertical FET cell 10 a body region 5a of the body layer 5 is surrounded by the gate layer 7 from two lateral surfaces 16 of the body region 5a opposite to each other and from a top surface 17 of the body region 5a opposite to the drift layer 2, wherein the top surface 17 of the body region 5a connects the two lateral surfaces 16 of the body region 5a. Therein, a distance $d_1$ between the two lateral surfaces 16 of each body region 5a is 1 µm or less, exemplarily 500 nm or less, more exemplarily 100 nm or less and even more exemplarily 20 nm or less. The two lateral surfaces 16 of each body region 5a are exemplarily parallel to each other. The distance $d_1$ is the double gate distance. The gate layer 7 is separated from the body region 5a and from the source layer 6 by the gate insulation layer 8. A first thickness of a first portion 8a of the gate insulation layer 8 separating the lateral surface 16 of each body region 5a from the gate layer 7 is in a range between 10 nm and 100 nm, a second thickness of a second portion 8b of the gate insulation layer 8 separating the top surface 17 of each body region 5a from the gate layer 7 is in a range between 10 nm and 500 nm and a ratio between the first thickness and the second thickness is less than 0.5, i.e. the second thickness is significantly higher than the first thickness.

Figure 4:
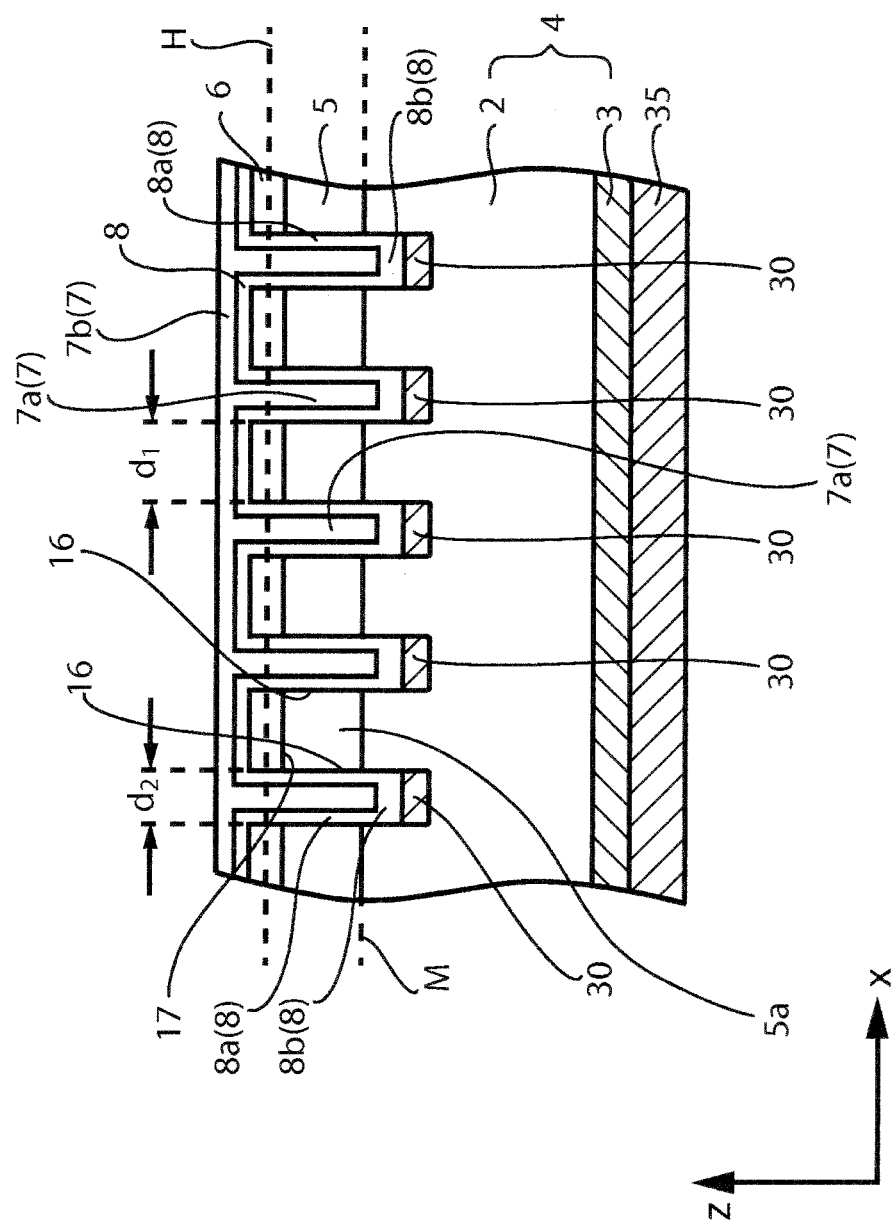
FIG. 4 shows a vertical cross-section along line CC' in FIG. 1 according to the comparative example.

As can be seen best from FIG. 4, the source layer 6 extends onto the top surface 17 of each body region 5a, so that the whole top surface 17 of each body region 5a is separated from the gate insulation layer 8 in a vertical direction z perpendicular to the main surface M of the substrate layer 4 by the source layer 6. Accordingly, the source layer 6 is in direct contact with each body region 5a, namely with the top surface 17 of each body region 5a.

In each row of vertical FET cells 10 the body regions 5a are separated from each other in the first horizontal direction x by first gate regions 7a of the gate layer 7, each first gate region 7a penetrating through the body layer 5, so that in each row of vertical FET cells 10 the first gate regions 7a alternate with the body regions 5a along the first horizontal direction x. The width of first gate regions 7a of the gate layer 7 in the second horizontal direction y is the gate width $w_g$ in each vertical FET cell 10. It is exemplarily in a range between 0.05 µm and 10 µm. A distance $d_2$ between each pair of body regions 5a neighbouring to each other in the first horizontal direction x is 1 µm or less, exemplarily 500 nm or less, more exemplarily 100 nm or less and even more exemplarily 20 nm or less. Throughout the description, the distance between two regions in a certain direction is the length of the shortest connecting line connecting the two regions with each other in the certain direction. As can be seen from FIGS. 1 to 4, the body regions 5a of each row of vertical field effect transistors 10 are connected with each other by a continuous portion of the body layer 5. At its two ends in the second horizontal direction y each first gate region 7a is covered and separated from the body layer 5 and the source layer 6 by insulating regions 18 as can be seen best in FIGS. 1 and 3.

The first gate regions 7a within each row of vertical FET cells 10 are connected with each other by second gate regions 7b extending across the body regions 5a of the respective vertical FET cells 10 in the first horizontal direction x. In particular, each second gate region 7b connects two first gate regions 7a of vertical FET cells 10 neighbouring to each other in the first horizontal direction x.

In a vertical projection onto a plane parallel to the main surface M of the substrate layer 4, in each row of vertical FET cells 10, the first gate regions 7a and the second gate regions 7b form a continuous gate strip extending with its longitudinal axis in the first horizontal direction x.

A p$^+$-type body contact region 25 is formed between each pair of adjacent gate strips neighbouring in the second horizontal direction y perpendicular to the first horizontal direction x and perpendicular to the vertical direction z. Each body contact region 25 is a continuous strip-shaped region having a doping level higher than that of the body layer 5 and penetrating through the source layer 6 to contact the body layer 5. Accordingly, in a vertical projection onto a plane parallel to the horizontal plane H, the gate strips alternate with the strip-shaped contact regions 25 in the second horizontal direction y. In a direction parallel to the second horizontal direction y the body contact regions 25 have exemplarily a width $w_{bcr}$ in a range between 0.1 µm and 5 µm. The distance $d_{bcr}$ between two adjacent body contact regions 25 neighbouring to each other in the second horizontal direction y is exemplarily in a range between 1 µm and 20 µm.

Figure 2:
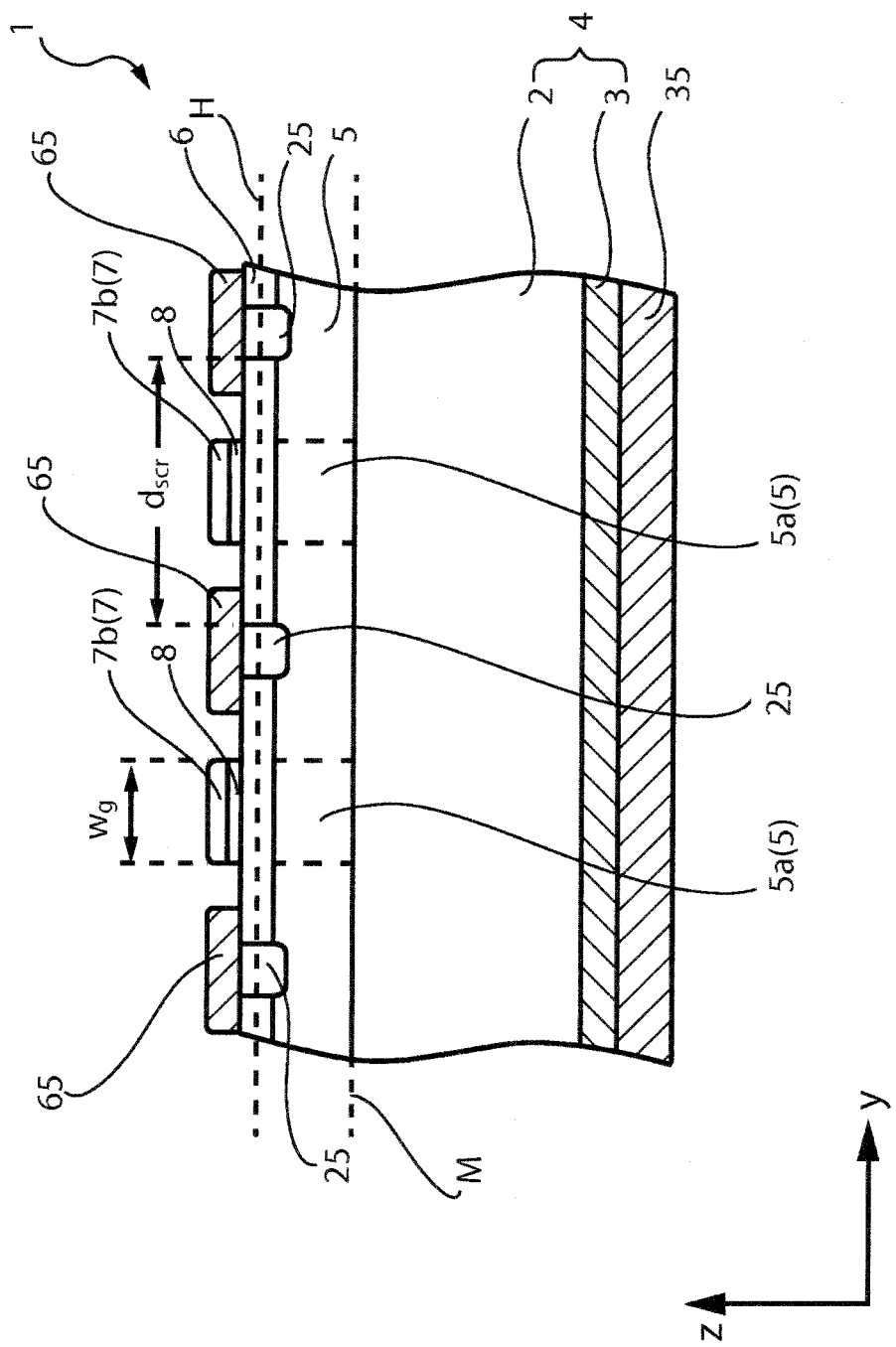
FIG. 2 shows a vertical cross-section along line AA' in FIG. 1 according to the comparative example.
Figure 3:
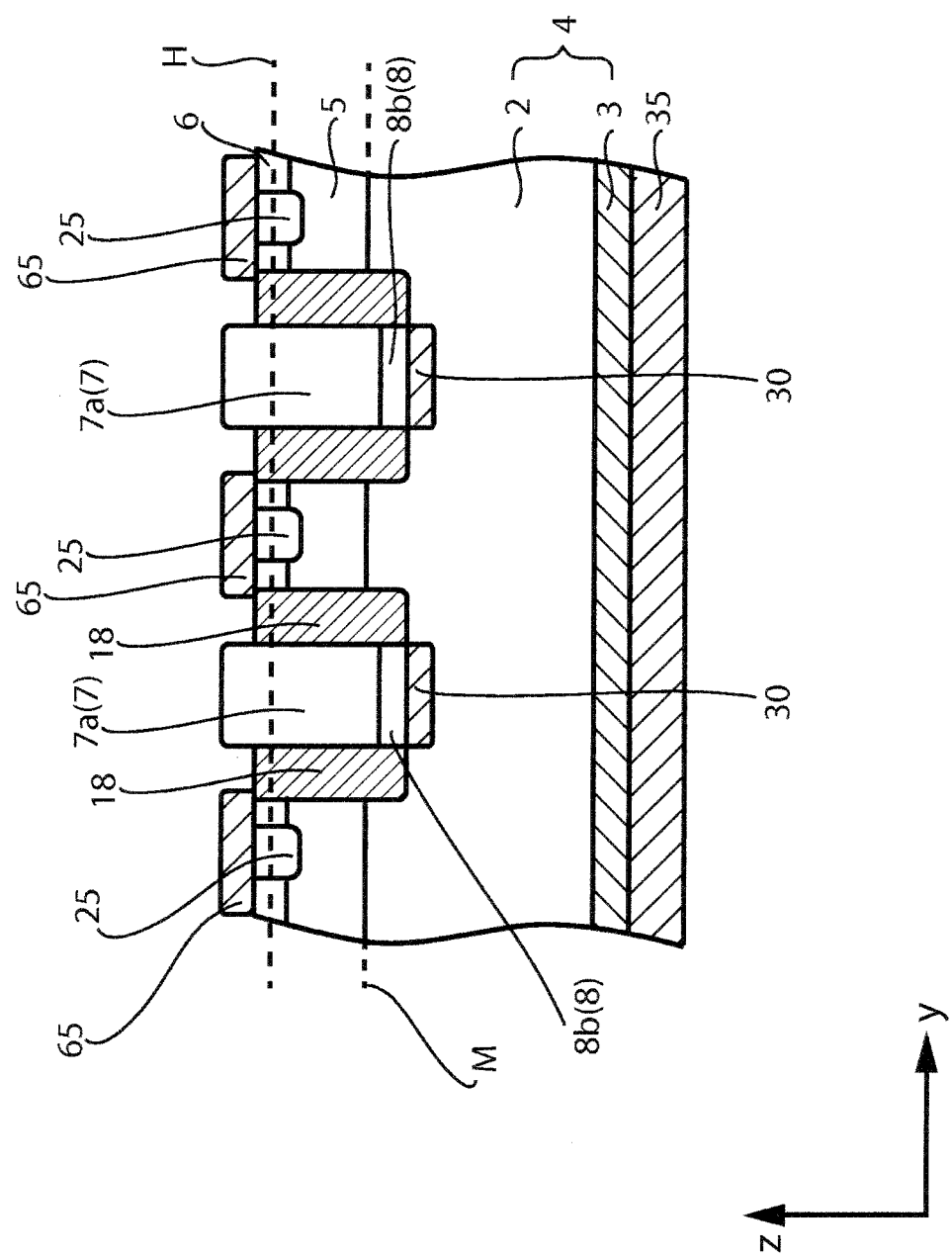
FIG. 3 shows a vertical cross-section along line BB' in FIG. 1 according to the comparative example.

As shown in FIGS. 2 and 3 a source electrode 65 is formed on the body contact regions 25 and on the source layer 6. The source electrode 65 comprises strip-shaped portions extending with its longitudinal axis in the first horizontal direction x and forms a first ohmic contact to the source layer 6 between each pair of adjacent gate strips. Further, the source electrode 65 is arranged on the body contact region 25 to form a second ohmic contact to the body contact region 25 between each pair of adjacent gate strips. In such manner the base and the emitter of a parasitic BJT formed by the body, source and drain of the device 1 can be efficiently shorted to keep it in an off-state. In a vertical projection onto a plane parallel to the horizontal plane H, the gate strips alternate with the strip-shaped portions of the source electrode 65 in the second horizontal direction y. Accordingly, in the vertical projection onto the plane parallel to the horizontal plane H, the gate strips alternate with the strip-shaped areas of the first and second ohmic contact between each pair of adjacent gate strips, wherein strip-shaped areas of the first and second ohmic contact are the areas of the interface between the source electrode 65 and the source layer 6 as well as of the interface between the source electrode 65 and the body contact region 25.

As can be seen from FIGS. 3 and 4, a p-type well region 30 is formed at a bottom side of each first gate region 7a, respectively, the bottom side facing towards the substrate layer 4. The well regions 30 are separated and electrically insulated from the first gate regions 7a by the second portion 8b of gate insulation layer 8. The p-type well region 30 and the relatively thick second portion 8b of the gate insulation layer 8 at the bottom of the first gate regions 7a help to protect the gate insulation layer 8 and in particular the second portion 8b of the gate insulation layer 8 against strong electric fields.

Figure 5:
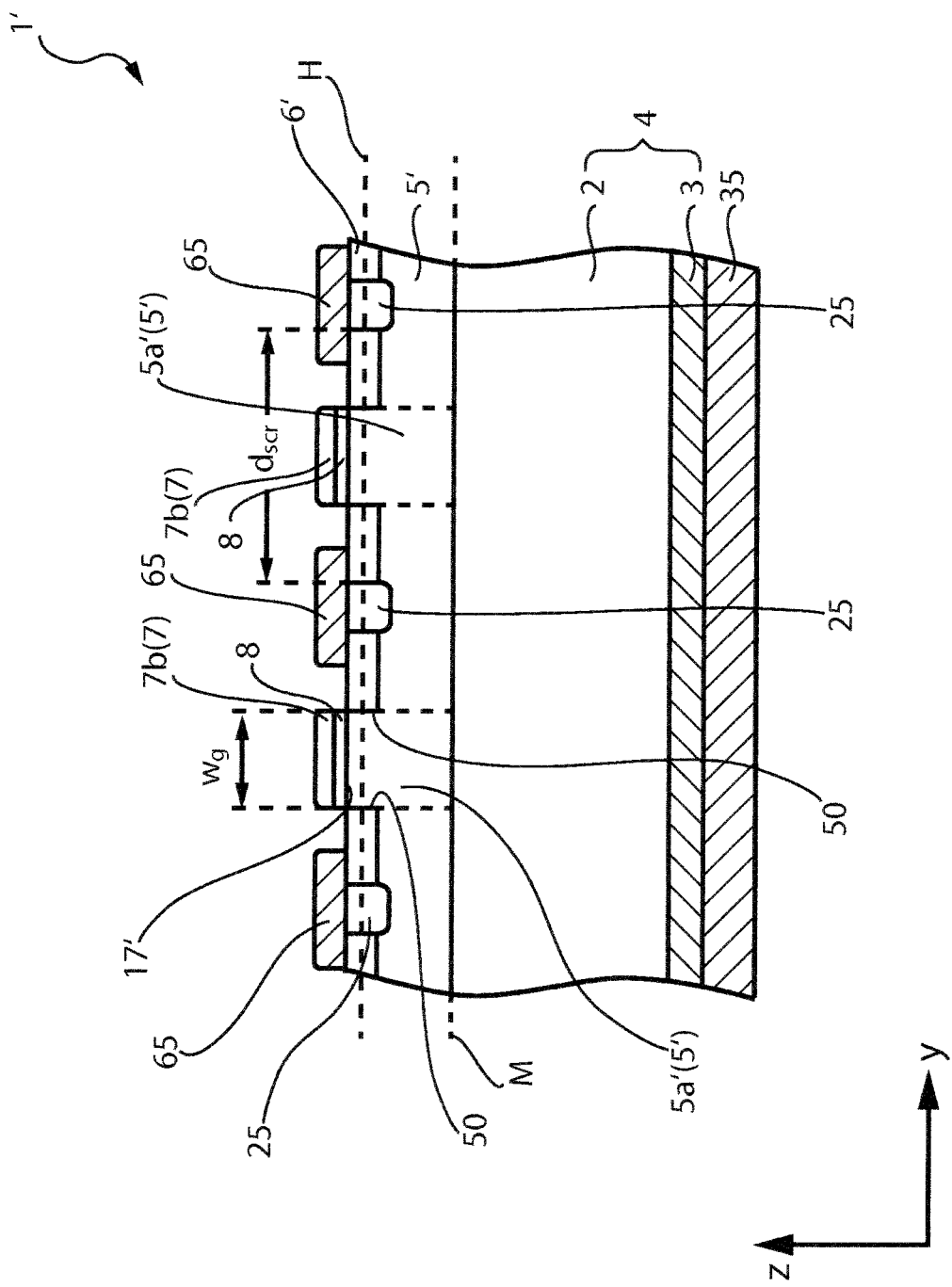
FIG. 5 shows a vertical cross-section along line AA' in FIG. 1 according to an embodiment of the invention.
Figure 6:
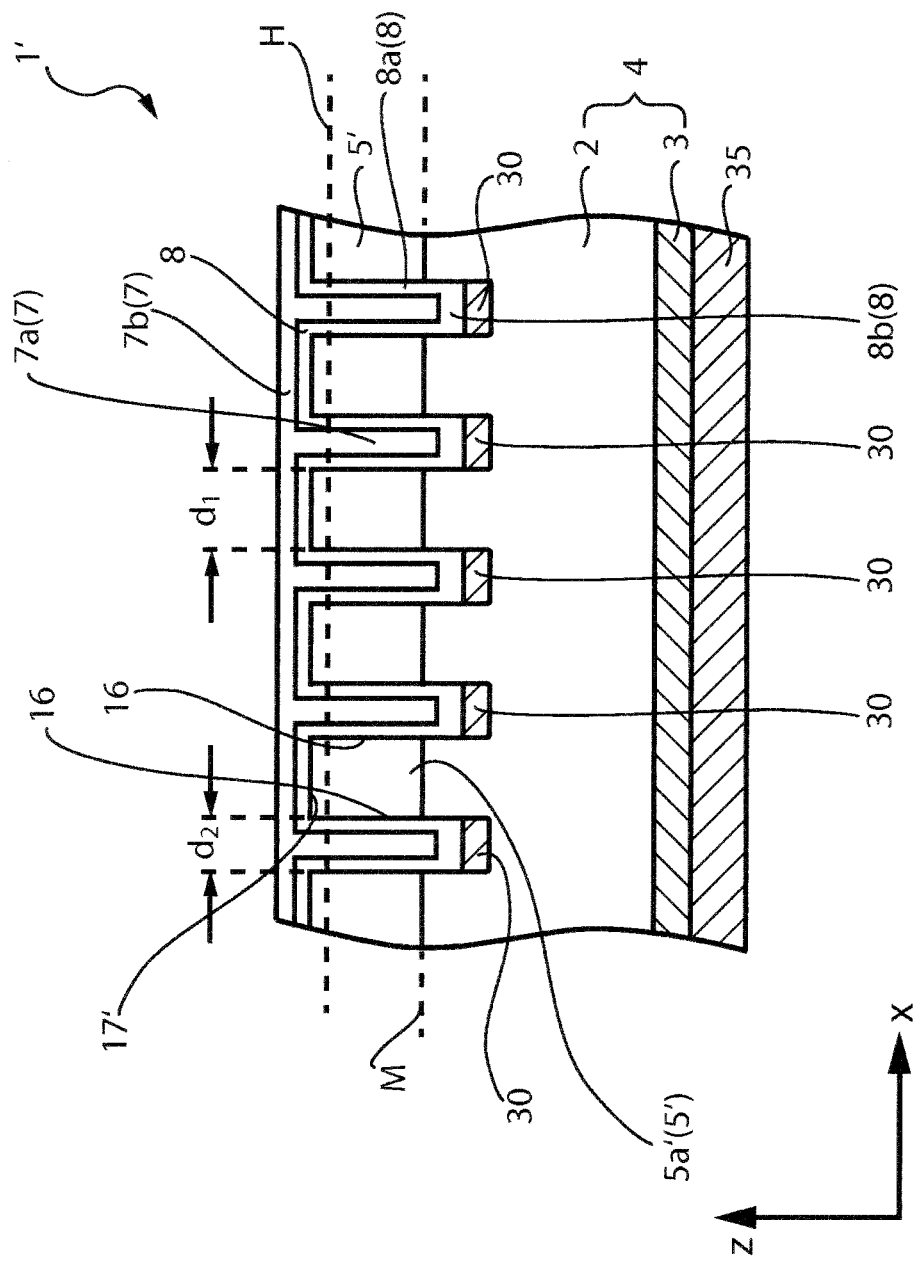
FIG. 6 shows a vertical cross-section along line CC' in FIG. 1 according to the embodiment.

An embodiment of the multi-gate trench silicon carbide (SiC) power MOSFET device 1' of the invention (in the following briefly referred to as device 1') is illustrated in FIGS. 5 and 6. As the device 1' according to the embodiment is similar to the above described device 1 according to the comparative example, only the differences will be described in the following. The remaining features are the same as discussed above with regard to the comparative example shown in FIGS. 1 to 4. Reference signs used in the Figures are the same, if elements referred to by the reference signs are identical.

FIG. 5 shows a vertical cross-section of device 1' corresponding to the cross-section shown in FIG. 2 along line AA' in FIG. 1. FIG. 6 shows a vertical cross-section of device 1' corresponding to the cross-section shown in FIG. 4 along line CC' in FIG. 1. The device 1' according to the embodiment differs from the device 1 according to the comparative example in that the source layer 6' of device 1' does not extend onto the top surface 17' of the body region 5a', such that the whole top surface 17' of the body region 5a' facing away from the substrate layer 4 is in direct contact with the gate insulation layer 8. However, also in the sembodiment the source layer 6' is in direct contact with each body region 5a', namely at lateral interfaces 50 extending in the vertical direction z and in the first horizontal direction x at the two ends of each body region 5a' in the second horizontal direction y as can be seen best from FIG. 5. Such embodiment has the advantage compared to the above discussed comparative example that the body regions 5a' are free of electrons in the off-state of the device 1'.

It will be apparent for persons skilled in the art that modifications of the above described embodiments are possible without departing from the idea of the invention as defined by the appended claims.

The above embodiments were explained with specific conductivity types. The conductivity types of the semiconductor layers in the above described embodiments might be switched, so that all layers which were described as p-type layers would be n-type layers and all layers which were described as n-type layers would be p-type layers. For example, in a modified embodiment, the substrate layer could be a p-type layer, the body layer could be an n-type layer and the source layer could be a p-type layer. In such case the multi-gate trench SiC power MOSFET would be a p-channel MOSFET device.

The above embodiments were described with well regions 30 formed at a bottom side of each first gate region 7a and with a body contact regions 25. However, the power semiconductor device of the invention does not necessarily comprise well regions 30 and body contact regions 25. In case that the power semiconductor device of the invention does not comprise these regions 25 and 30, it can be manufactured without any ion implantation step to facilitate the manufacturing of the power semiconductor device. It is also possible that the power semiconductor device comprises the body contact regions 25 but not the well regions 30 or vice versa.

In the above embodiments, there may be formed additional layers, such as one or more isolation layer covering the gate layer 7 and/or the source electrode 65. When the gate layer 7 is covered by such additional isolation layer, a conductive layer extending above such isolation layer may be connected to the gate layer 7 by vias through such isolation layer. Likewise another conductive layer extending above an isolation layer covering the source electrode may be connected to the source electrode 65 by vias through such isolation layer.

Also, in the power semiconductor device of the invention the semiconductor layers, i.e. the substrate layer 4, the body layer 5 and the source layer 6 may not be made of SiC material but of any other semiconductor material suitable for power semiconductor devices. In particular, the semiconductor layers may be made from another wide bandgap semiconductor such as a group-III-Nitride (AlGaIn)N.

It should be noted that the term "comprising" does not exclude other elements or steps and that the indefinite article "a" or "an" does not exclude the plural. Also elements described in association with different embodiments may be combined.

LIST OF REFERENCE SIGNS 1, 1' (multi-gate trench SiC power MOSFET) device
2 (n-type) drift layer
3 (n-type) drain layer
4 substrate layer
5, 5' (p-type) body layer
5a, 5a' body region
6, 6' ($n^+$-type) source layer
7 gate layer
7a first gate region
7b second gate region
8 gate insulation layer
8a first portion of the gate insulation layer 8
8b second portion of the gate insulation layer 8
10 vertical field effect transistor (FET) cells
16 lateral surface
17, 17' top surface
18 insulating region
25 ($p^+$-type) body contact region
30 (p-type) well region
35 drain electrode
50 lateral interface
65 source electrode
$d_1$ distance (between the two lateral surfaces 16 of each body region 5a)
$d_2$ distance (between two body regions 5a neighbouring in the first horizontal direction x)
$d_{bcr}$ distance (between adjacent body contact regions 25)
H horizontal plane
M main surface
$w_{bcr}$ width $w_g$ gate width
x first horizontal direction
y second horizontal direction
z vertical direction

The invention claimed is:

1. A power semiconductor device comprising:
a substrate layer having a first conductivity type;
a body layer provided on the substrate layer and having a second conductivity type, which is different from the first conductivity type;
a source layer provided on the body layer and having the first conductivity type;
an electrically conductive gate layer penetrating through the body layer,
a gate insulation layer electrically insulating the gate layer from the substrate layer, from the body layer and from the source layer;
wherein the power semiconductor device includes a plurality of vertical field effect transistor cells,
wherein the plurality of vertical field effect transistor cells are arranged in a plurality of parallel rows, each row including vertical field effect transistor cells arranged along a first direction,
wherein in each vertical field effect transistor cell a body region of the body layer is surrounded by the gate layer from two lateral surfaces of the body region opposite to each other and from a top surface opposite to the substrate layer and connecting the two lateral surfaces, the gate layer being separated from the body region by the gate insulation layer,
wherein in each row of vertical field effect transistor cells the body regions are separated from each other in the first direction by first gate regions of the gate layer, each first gate region penetrating through the body layer, so that in each row of vertical field effect transistor cells the first gate regions alternate with the body regions along the first direction,
wherein the first gate regions within each row of vertical field effect transistor cells are connected with each other by second gate regions extending across the body regions of the respective vertical effect transistor cells in the first direction,
wherein, in a vertical projection onto a plane parallel to a main surface of the substrate layer, in each row of vertical field effect transistor cells, the first gate regions and the second gate regions form a continuous gate strip extending with its longitudinal axis in the first direction,
wherein a source electrode is formed on the source layer to form a first ohmic contact to the source layer between each pair of adjacent gate strips, and
wherein the source layer is in direct contact with each body region at lateral interfaces extending in the vertical direction and in the first horizontal direction at the two ends of each body region in the second horizontal direction orthogonal to the first horizontal direction,
wherein the source layer does not extend onto the top surface of the body region such that the whole top surface of the body region facing away from the substrate layer is in direct contact with the gate insulation layer.

2. The power semiconductor device according to claim 1, comprising a body contact region between each pair of adjacent gate strips, each body contact region being a semiconductor region of the second conductivity type having a doping level higher than that of the body layer and penetrating through the source layer to extend to and contact the body layer, wherein the source electrode is arranged on the body contact region to form a second ohmic contact to the body contact region between each pair of adjacent gate strips.

3. The power semiconductor device according to claim 1, wherein a distance between the two lateral surfaces of each body region is 500 nm or less.

4. The power semiconductor device according to claim 1, wherein a first thickness of a first portion of the gate insulation layer separating the lateral surface of each body region from the gate layer is in a range between 10 nm and 100 nm.

5. The power semiconductor device according to claim 1, wherein a second thickness of a second portion of the gate insulation layer separating the top surface of each body region from the gate layer is in a range between 10 nm and 500 nm.

6. The power semiconductor device according to claim 5, wherein a ratio between the first thickness and the second thickness is less than 0.5.

7. The power semiconductor device according to claim 1, wherein the distance between each pair of body regions neighbouring in the first direction is 500 nm or less.

8. The power semiconductor device according to claim 1, wherein the source layer extends onto the top surface of each body region.

9. The power semiconductor device according to claim 8, wherein the whole top surface of each body region is separated from the gate insulation layer in a direction vertical to the main surface of the substrate layer.

10. The power semiconductor device according to claim 1, wherein a semiconductor well region of the second conductivity type is formed on a bottom side of each first gate region facing towards the substrate layer, the semiconductor well region being separated and electrically insulated from the first gate region by the insulation layer.

11. The power semiconductor device according to claim 1, wherein at least the substrate layer, the body layer and the source layer are formed of silicon carbide.

12. The power semiconductor device according to claim 1, wherein each body contact region between two adjacent gate strips is a continuous strip-shaped region.

13. The power semiconductor device according to claim 1, wherein at least the body regions of each row of vertical field effect transistors are connected with each other by a continuous portion of the body layer.

14. The power semiconductor device according to claim 1, wherein the lateral surfaces of each body region are parallel to each other.

15. The power semiconductor device according to claim 2, wherein a distance between the two lateral surfaces of each body region is 500 nm or less.

16. The power semiconductor device according to claim 2, wherein a first thickness of a first portion of the gate insulation layer separating the lateral surface of each body region from the gate layer is in a range between 10 nm and 100 nm.

17. The power semiconductor device according to claim 3, wherein a first thickness of a first portion of the gate insulation layer separating the lateral surface of each body region from the gate layer is in a range between 10 nm and 100 nm.

18. The power semiconductor device according to claim 2, wherein a second thickness of a second portion of the gate insulation layer separating the top surface of each body region from the gate layer is in a range between 10 nm and 500 nm.

19. The power semiconductor device according to claim 3, wherein a second thickness of a second portion of the gate insulation layer separating the top surface of each body region from the gate layer is in a range between 10 nm and 500 nm.

20. The power semiconductor device according to claim 4, wherein a second thickness of a second portion of the gate insulation layer separating the top surface of each body region from the gate layer is in a range between 10 nm and 500 nm.

* * * * *

UNITED STATES PATENT AND TRADEMARK OFFICE
CERTIFICATE OF CORRECTION

Page 1 of 1

PATENT NO. : 10,490,658 B2
APPLICATION NO. : 16/052981
DATED : November 26, 2019
INVENTOR(S) : Lars Knoll and Renato Minamisawa It is certified that error appears in the above-identified patent and that said Letters Patent is hereby corrected as shown below:

In the Claims

On Claim 5 Column 10, Line 13 replace "1" with "4".

On Claim 7 Column 10, Line 22 replace "the" with "a".

Signed and Sealed this
Third Day of March, 2020

Andrei Iancu
*Director of the United States Patent and Trademark Office*